United States Patent [19]

Valkov et al.

[11] Patent Number: 4,970,684

[45] Date of Patent: Nov. 13, 1990

[54] ASSOCIATIVE MAIN STORE

[75] Inventors: Plamen K. Valkov; Lyudmil G. Dakovski, both of Sofia, Bulgaria

[73] Assignee: Vmei "Lenin", Sofia, Bulgaria

[21] Appl. No.: 206,063

[22] Filed: Jun. 13, 1988

[51] Int. Cl.$^5$ .............................................. G11C 15/00
[52] U.S. Cl. ................................. 365/49; 365/189.01; 365/195; 364/900
[58] Field of Search ............ 365/49, 189, 195, 189.01, 365/189.07; 364/200 MS File, 900 MS File

[56] References Cited

U.S. PATENT DOCUMENTS

| | | | |
|---|---|---|---|
| 3,195,109 | 7/1965 | Behnke | 364/900 |
| 4,069,473 | 1/1978 | Vitaliev et al. | 365/49 |
| 4,257,110 | 3/1981 | Lamb et al. | 365/49 |
| 4,296,475 | 10/1981 | Wederluf et al. | 365/49 |

OTHER PUBLICATIONS

Kraizmer et al., "Associative Main Stores", Library on Automatics, No. 245, Energiya, 1967.

Primary Examiner—Glenn A. Gossage
Attorney, Agent, or Firm—Klein & Vibber

[57] ABSTRACT

An associative main store, having application in computing technology and automation, avoids disadvantages of well-known associative main stores which have a great number of external outputs due to the presence of inputs to address every memory cell, and which require that the addresses be stored in an extra external device. The invention is able to increase the digits of the associative conditions facilitating operation by the user and providing extended functional possibilities. Instead of having only one associative function: "associative YES/NO reading" the invention has four new associative functions in addition: "multiple response" where all numbers written in the associative main store equivalent to the preset masked input information are read; "all numbers smaller than a preset number" where all numbers written in the associative main store being smaller than a given input information are read; "all numbers bigger than a preset number" where all numbers written in the operative storage bigger than the preset input information are read; and "all numbers in the FROM/TO interval" where all numbers written in the associative main store entering a preset interval or being outside a preset interval are read. Bidirectional input-output data buses are used in order to avoid any considerable increase in the number of the device outputs.

13 Claims, 7 Drawing Sheets

ASSOCIATIVE MAIN STORE

FIELD OF THE INVENTION

The present invention relates to an Associative Main Store finding application in computing technology and automation.

PRIOR ART

In order to familiarize the reader with certain concepts and terminology presented in this application, reference should be had to the following publications, the complete disclosures of which are incorporated herein by reference: U.S. Pat. Nos. 4,622,653; 4,404,653; 4,377,855; 4,296,475; 4,188,670; 4,187,551; 4,068,305; 4,062,00I; and 4,044,338; and "Associate by Memory Sequencing Arrangement," IBM Technical Disclosure Bulletin Vol. 15, No. 7, Dec. 1972; "Subselection in Associative Store," IBM Technical Disclosure Bulletin Vol. 12, No. 11, Apr. 1970; and "Associative Memory Chips," Electronics Aug. 17, 1970.

BACKGROUND OF THE INVENTION

A known associative main store is disclosed in Kraizmer, L.P., et al, "Associative Main Stores" (in Russian), Library on Automatics, No. 245, Energiya, 1967. In the known device, the outputs of two decoders for selection of memory cells in rows and columns are connected to the memory matrix, and outputs of address signal buffers are connected to their inputs. The input information data are fed to the inputs of an input data register, the outputs of which are connected to the inputs of a masking register the outputs of which are connected to the inputs of the memory matrix and part of the inputs of a comparator. The memory matrix outputs are connected to the remaining comparator inputs, the outputs of the comparator being connected to part of the inputs of an output data register, the output of which is connected to the input of the output buffer. The external read/write input is one of the inputs of the input information data register, the external input of the chip selection being one of the inputs of the output data register, and the external masking input is part of the masking register inputs.

The great number of external outputs due to the presence of inputs to address every memory cell and the related inconvenience that the addresses should be stored in an extra external device is a disadvantage of the known associative main store. Considering the limitations on the number of outputs in standard integrated packages, the presence of additional address buses is at the expense of the information inputs for associative retrieval, i.e. the digits of the associative condition are limited. The known device therefore has limited functional potential. It can realize only one associative function—"associative YES/NO reading".

It is an object of this invention to make an Associative Main Store having potentials for increasing the digits of the associative condition, facilitating its operation from the user's point of view and having extended functional possibilities

SUMMARY OF THE INVENTION

These objects are achieved by an Associative Main Store comprising an input-output information data unit having M-bit input/output external bidirectional input-output data buses and M-bit bidirectional input-output data buses which are connected to the corresponding bidirectional input-output data buses of an input-output information data register.

The output bus of the masking register is connected to the input bus of the memory matrix containing memory cells and comparators of them. The first matrix output bus is connected to the input-output information data register, and the second output bus is connected to the address register, the output bus of which is connected to the input bus of the memory matrix. The output buses of a multiple response register are connected to the input bus of the input-output information data register, the memory matrix input bus and the output unit input bus, the remaining input bus of the output unit being connected to the output bus of the address register, the output bus of a control unit and output bus of an interval unit. The remaining output bus of the interval unit is connected to the input bus of the input-output information data unit.

The output buses of the control unit are connected to the input bus of the input-output information data unit, input bus of the input-output information data register, input bus of the masking register, input bus of the address register, input bus of the register for multiple response and the input bus of the interval, unit. The input bus of the control unit is connected to external inputs of the device for chip selection, for reading/writing, for deleting, for reset for masking for multiple response, for all numbers bigger than a preset number, for all numbers smaller than a preset number and to an output of the address register.

The bidirectional input-output data buses of the input-output information data unit and of the input-output information data register are also connected to the corresponding input buses of the interval unit, and the memory matrix output bus is connected to the input bus of the multiple response unit. The output of the output unit is an external information output of the device.

An advantage of this new device is that no external address signals are used to address each memory cell of the memory matrix which reduces the number of the external outputs and enables increasing the digits of the associative condition and simultaneously facilitates its operation.

Four new associative functions are introduced: "multiple response", where all numbers written in the Associative Main Store equivalent to the preset masked input information are read; "all numbers smaller than a preset number", where all numbers written in the Associative Main Store being smaller than a given input information are read; "all numbers bigger than a preset number", where all numbers written in the operative storage bigger than the preset input information are read; "all numbers in the FROM/TO interval", where all numbers written in the Associative Main Store entering a preset interval or being outside a preset interval are read. Bidirectional input-output data buses are used in order to avoid any considerable increase in the number of the device outputs.

BRIEF DESCRIPTION OF THE DRAWING

With these and other objects in view, which will become apparent in the following detailed description the present invention, which is shown by example only, will be clearly understood in connection with the accompanying drawing, in which.

DESCRIPTION OF THE PREFERRED EMBODIMENT

Figure 1:
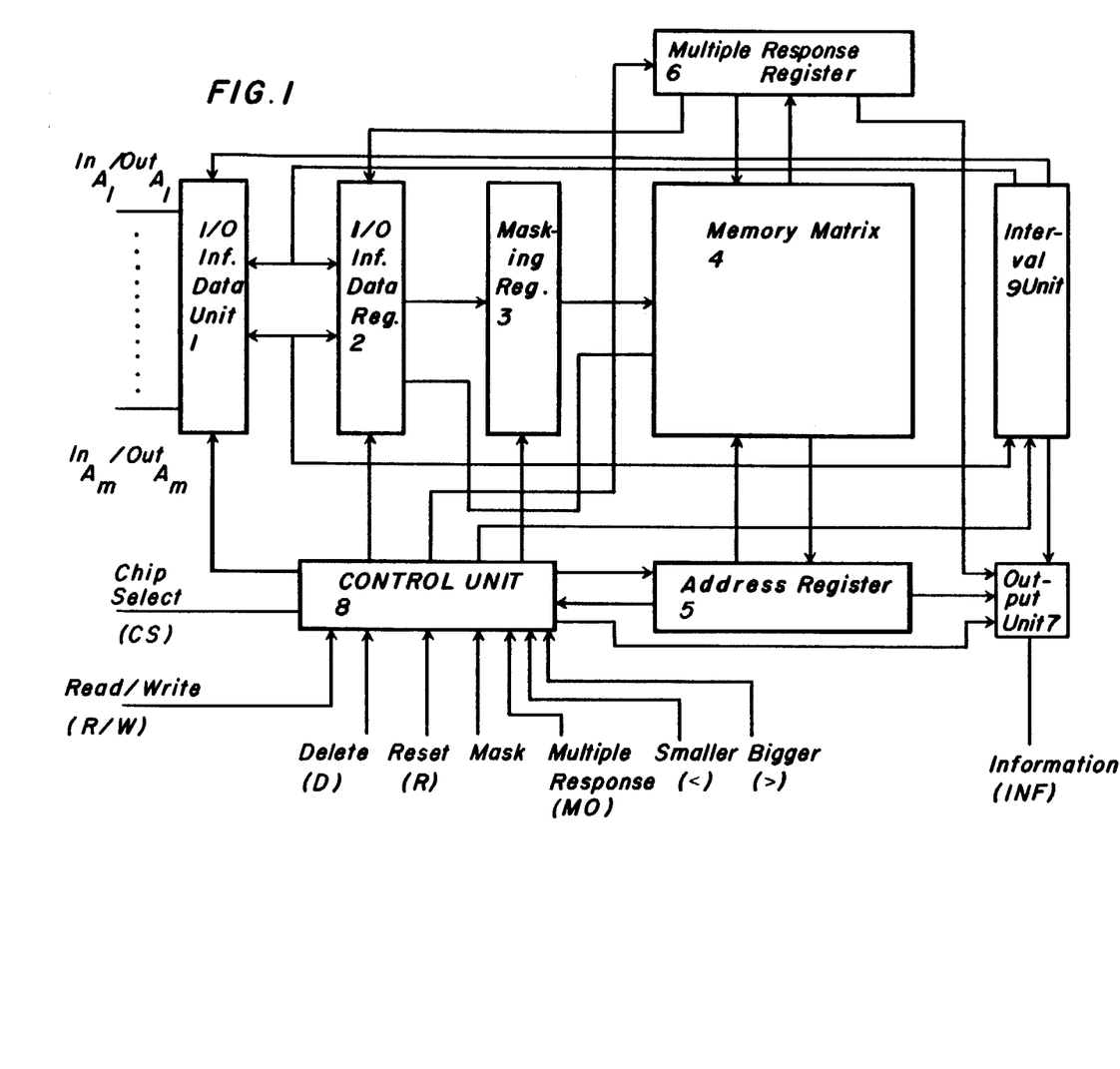
FIG. 1 is a block diagram of the Associative Main Store.

Referring first to FIG. 1, the associative main store of the invention comprises an input-output information data unit 1 having an M-bit external bidirectional input-output data buses ($INa_{(1)}/OUTa_{(1)}$-$INa_{(m)}/OUTa_{(m)}$) and M-bit bidirectional input-output data buses which are connected to the corresponding bidirectional input-output data buses of an input-output information data register 2, the bus of which is connected to the input bus of a masking register 3.

The output bus of the masking register 3 is connected to the input bus of a memory matrix 4 containing memory cells and appurtenant comparators, the first output bus of which is connected to the input-output information data register 2, and the second output bus being connected to an address register 5, an output bus of which is connected to the input bus of the memory matrix 4.

The output buses of a multiple response register 6 are connected to the input bus of the input-output information data register 2, input bus of the memory matrix 4 and input bus of output unit 7. The remaining input buses of the output unit 7 are connected to the output bus of the address register 5, output bus of a control unit 8 and output bus of an interval unit 9. The output bus of the interval unit 9 is also connected to the input bus of the input-output information data unit 1.

The output buses of the control unit 8 are connected to input bus of the input-output information data unit 1, input bus of the input-output information data register 2, input bus of the masking register 3, input bus of the multiple response register 6 and input bus of the interval unit 9.

The input bus of control unit 8 is connected to the external inputs CHIP SELECT (CS or NCS), READ/WRITE (R/W), DELETE (D), MASK, RESET (R), MULTIPLE RESPONSE (MO), for all numbers smaller than a preset number SMALLER (<), for all numbers bigger than a present number BIGGER (>), and to an output of the address register 5.

The bidirectional input-output buses of the input-output information data unit 1 and of the input-output information data register 2 are connected to the corresponding input buses of the interval unit 9. The output bus of the memory matrix 4 is connected to the input bus of the multiple response register 6. The output of the output unit 7 is an external data output INFORMATION (INF) of the device.

Input-output information data unit 1 functions as a coordinating buffer (for TTL compatibility) for the input, as well as for the output information.

Input-output information data register 2 receives the condition for each associative function. In the subcycle "read", the register functions as an output buffer for the information registered in memory, and meets the set condition.

The INF output 7 is a single bit, but it is multifunctional. In the function "associative reading YES/NO", logical 1 of this output means that the input information is contained in memory (YES), and logical 0 means that the information is absent (NO). In the function "writing of information", logical 1 at INF means that the memory is overfilled and this is a condition for selecting a new circuit (through $\sim$CS) in the memory unit. In the function "multiple response", logical 1 at INF means the end of the function, thus sparing machine cycles of the computer in which the memory works.

The control unit 8 is responsible for generating several clock signals ($\sim T_W$, $\sim T_{del}$, R, $T_{MASK}$, $T_{MO}$, $T_{W<}$, $T_{W>}$, $\sim T_<$, and $\sim T_>$) which are discussed in detail below. Clock unit 8 also passes clock MASK to Masking register 3.

Other clock signals are generated by different parts of the circuit, e.g. $T_{W(i)}$ by register 5 (FIG. 4), $T_{Ri}$ by register 6 (FIG. 5), $T_{WE(i)}$, $T_{WE(i+1)}$, etc. are generated by bits of register 5, and $T_{RE(i)}$, $T_{RE(i+1)}$, etc. are generated by bits of register 6.

Figure 2:
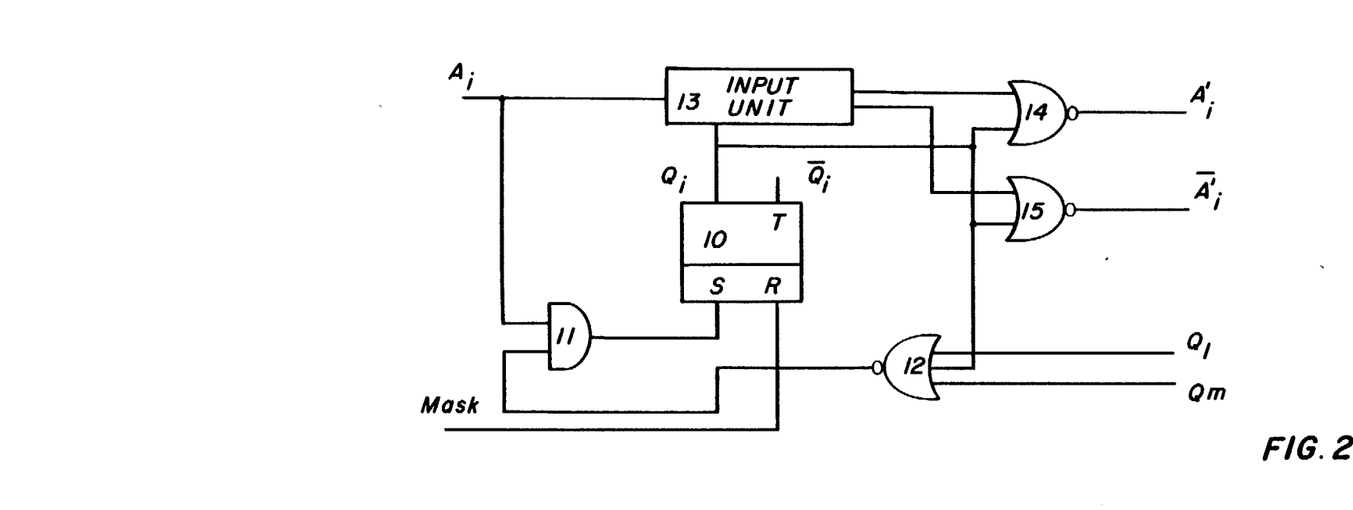
FIG. 2 is a logical schematic of the masking function of an arbitrary (random) bit of the input data.

Referring now to FIG. 2, the masking register 3 comprises M stages, one of which (i) is shown in detail here. Each stage of masking register 3 contains a flip-flop 10, one of the inputs of which is connected to an internal masking clock MASK. Its other input is connected to the output of first AND gate 11, the inputs of which are connected to the respective output $A_i$ of the input-output information data register 2 and the output of first NOR gate 12. The inputs of NOR gate 12 are connected to the Q-outputs of the flip-flops of all stages of the masking register 3. The $Q_i$ output of flip-flop 10 is also connected to the input of input unit 13 and an input of second NOR gate 14 and an input of third NOR 15. Input unit 13 is a standard device such as a delay line comprising a number of series inverters.

One of the outputs of input unit 13 is connected to another input of NOR gate 14 and the other output is connected to another input of NOR gate 15. The $A'_i$ output of NOR gate 14 and output $\sim A'_i$ of NOR gate 15 are connected to inputs of the memory matrix 4. Output $A_i$ of the input-output information data register 2 is connected to an input of input unit 13.

Figure 3:
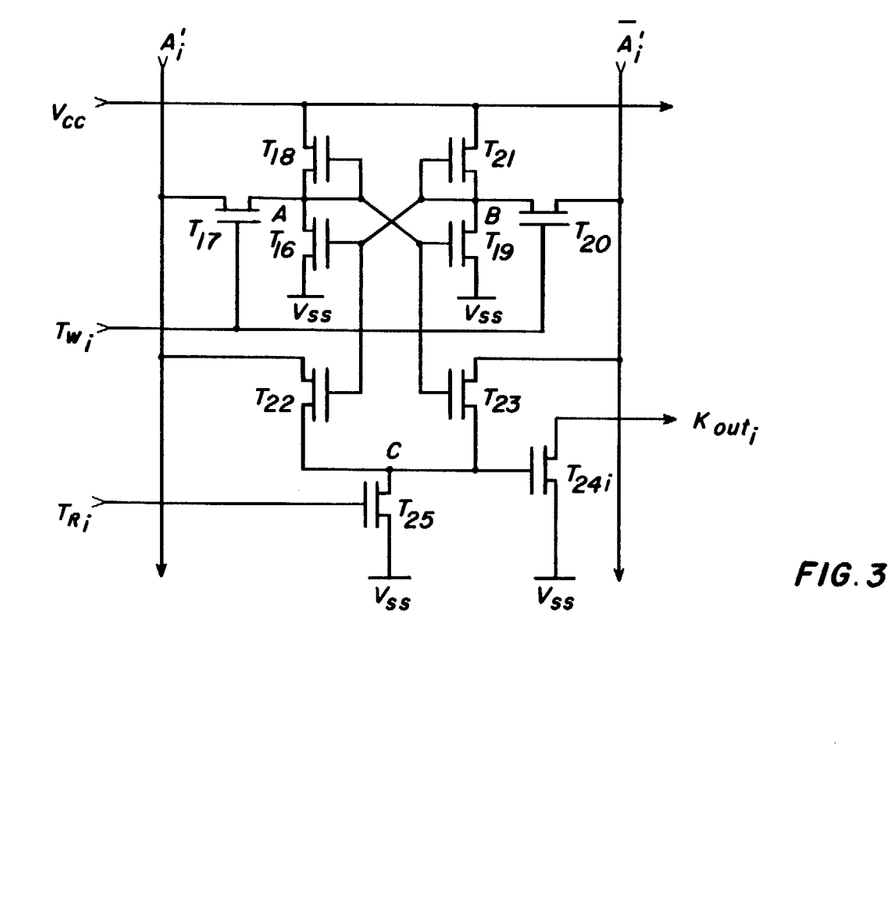
FIG. 3 is a logical schematic of a memory cell of the Associative Main Store.

Referring now to FIG. 3, the memory matrix 4, organized in M rows and N columns, comprises a number (N×M) of memory cells in each of which (i) the drain of first transistor T16 is connected to the source of second transistor T17, the source and gate of third transistor T18, the gate of fourth transistor T19 and the gate of fifth transistor T23.

Output $A'_i$ of NOR gate 14 (FIG. 2) is connected to the drain of transistor T17 and the drain of sixth transistor T22, and output $\sim A'_i$ NOR gate 15 (FIG. 2) is connected to the drain of seventh transistor T20 and the drain of transistor T23.

The bus of internal writing clock $T_{W(i)}$ is connected to the gates of transistors T17 and T20, and the drain of transistor T19 is connected to the source of transistor T20, the source and gate of eighth transistor T21, the gate of transistor T16 and the gate of transistor T22. The source of transistor T22 is connected to the source of transistor T23, the drain of ninth transistor T25 and the gate of tenth transistor T24 (T24$_i$), the drain of which is an output K$_{out(i)}$ of the memory cell (i).

The internal reading clock T$_{R(i)}$ is connected to the gate of transistor T25. The circuit supply voltage V$_{cc}$ is connected to the drains of transistors T18 and T21, and the common ground of the circuit V$_{ss}$ is connected to the sources of transistors T16, T19, T24$_i$, T25.

Figure 4:
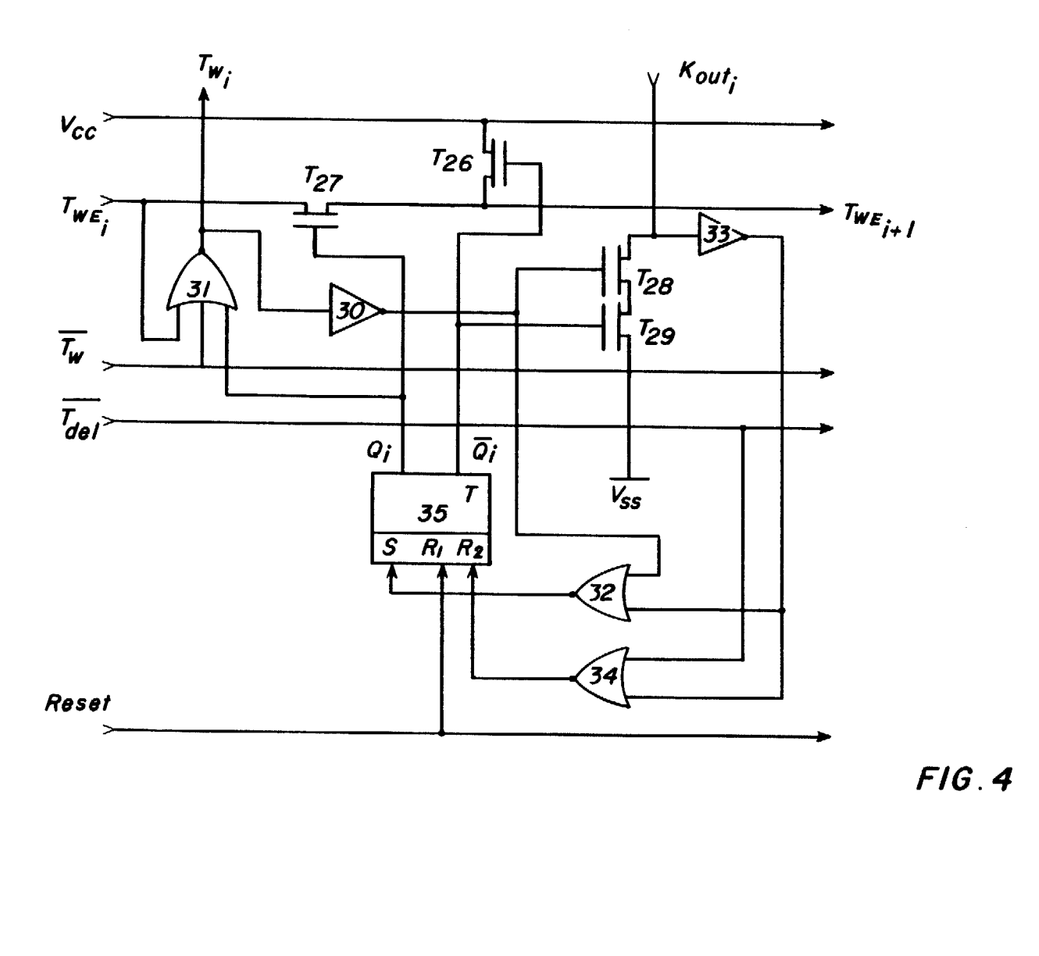
FIG. 4 is a logical schematic of a stage of the address register.

Referring now to FIG. 4, the address register 5 comprises N individual stages each (i) containing second flip-flop 35, one input of which is connected to the reset internal clock bus R, another input is connected to the output of fourth NOR gate 32 and its third input is connected to the output of fifth NOR gate 34.

One of the inputs of NOR gate 34 is connected to the bus of the internal clock for information delete $\sim$T$_{del}$ and its other input is connected to the output of first inverter 33, the input of which is connected to an output of the memory cell K$_{out(i)}$ and the drain of eleventh transistor T28. The gate of transistor T28 is connected to the output of second inverter 30 and its source is connected to the drain of twelfth transistor T29. The gate of transistor T29 is connected to the gate of thirteenth transistor T26 and output $\sim$Q$_i$ of flip-flop 35.

Output Q$_i$ of flip-flop 35 is connected to the gate of fourteenth transistor T27 and an input of sixth NOR gate 31, the second input of which is connected to the bus for internal writing clock $\sim$T$_W$, and its third input is connected to the bus of the internal clock for write enabling T$_{WE(i)}$. The bus of internal clock for write enabling T$_{WE(i)}$ is also connected to the source of transistor T27, the drain of which is connected to the source of transistor T26, and is for internal clock signal T$_{WE(i+1)}$ for write enabling to the next stage (i+1) of the address register 5.

The drain of transistor T26 is connected to the supply voltage V$_{cc}$ of the circuit. The output of NOR gate 31 is a writing clock T$_{W(i)}$ and is also connected to an input of inverter 30. The output of inverter 30 is connected to one input of NOR gate 32, another input of which is connected to the output of inverter 33. The source of transistor T29 is connected to the common ground of circuit V$_{ss}$.

The connection between register 5 and control unit 8 (shown in FIG. 1) is not shown in FIG. 4 since this figure represents only one stage of register 5. The connection from register 5 to control unit 8 generates a signal to forbid generation of clock $\sim$T$_W$ if the input information is contained in memory, so as to avoid duplication of writing of the same information. This condition is logically worked out by all stages of register 5. The connections between register 6, register 2 and output unit 7 are analogous to the connection just mentioned.

In principle, if at least one stage of register 6 is actuated, i.e. there is at least one word (digit) in memory, corresponding to the function "multiple response" then a clock is generated from register 6 to register 2 in order to switch over register 2 from receiving (input) information to emitting (output) information. Upon reading the last word in memory, corresponding to the condition, register 6 generates a clock to unit 7, and on output INF there appears logical 1 as an indication of the end of the function.

In FIG. 4, the connection to memory matrix 4 is K$_{out(i)}$, and the connection to control unit 8 is $\sim$T$_W$, $\sim$T$_{del}$, and R. When the output unit 7 is in the "recording" state, a combined action is exercised by the control unit 8 under the influence of an external R/W and of an N-input OR gate, at the inputs of which there are generated the Q outputs of all N number of triggers of the address register 5. Thus, in this state of output INF, memory overflow is registered.

Figure 5:
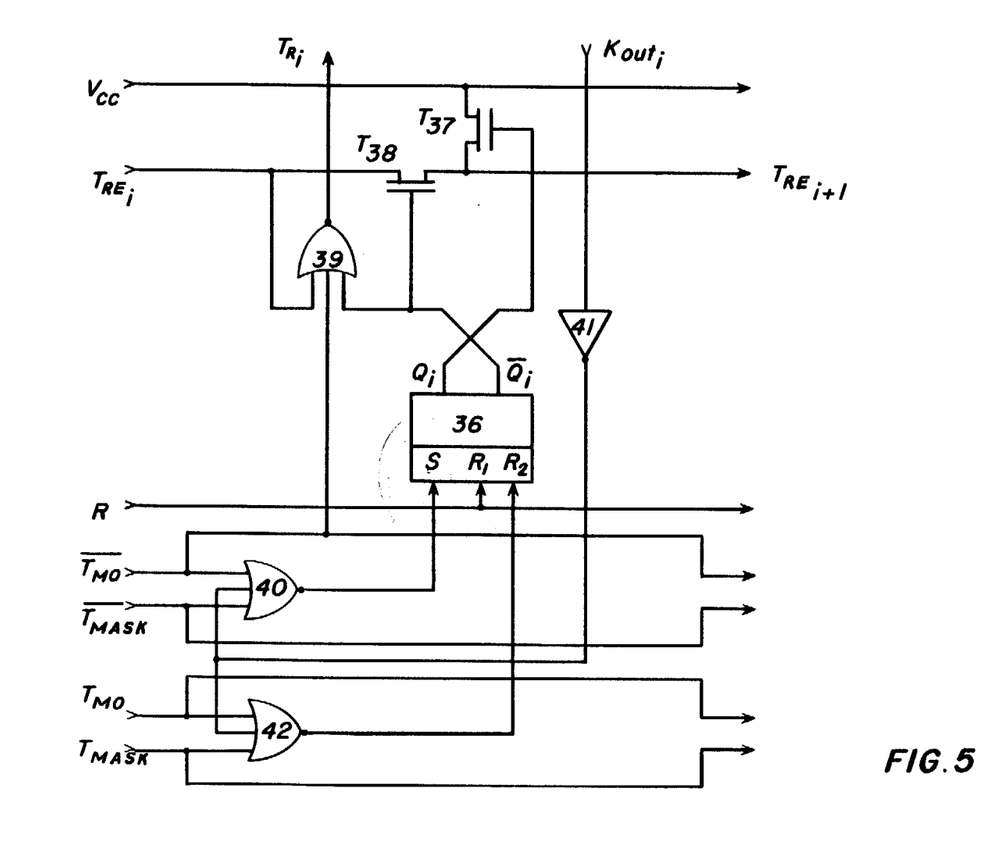
FIG. 5 is a logical schematic of a stage of the multiple response register.

Referring now to FIG. 5, the multiple response register 6 consists of a number (N) of individual stages (i) each containing third flip-flop 36, the output Q$_i$ of which is connected to the gate of fifteenth transistor T37, and its inverse output $\sim$Q$_i$ is connected to the gate of sixteenth transistor T38 and an input of seventh NOR gate 39. The output of NOR gate 39 is a reading clock T$_{R(i)}$ and its second input is connected to the bus of the internal clock for reading enabling T$_{RE(i)}$ which is connected also to the source of transistor T38.

The drain of T38 is connected to the source of transistor T37, the drain of which is connected to the supply voltage of circuit V$_{cc}$. The source of transistor T37 is for internal clock signal T$_{RE(i+1)}$ for reading enabling to the next stage of the multiple response register 6.

The third input of NOR gate 39 is connected to an internal clock for multiple response $\sim$T$_{MO}$ which is also connected to an input of eighth NOR gate 40. The output of NOR gate 40 is connected to an input of third flip-flop 36. The internal masking clock $\sim$T$_{MASK}$ is connected to another input of NOR gate 40, another input of which is connected to the output of third inverter 41 and an input of ninth NOR gate 42.

The output of NOR 42 is connected to an input of flip-flop 36. The internal multiple response clock T$_{MO}$ and the internal masking clock T$_{MASK}$ are connected to the other inputs of NOR gate 42, and the internal clock of general reset R is connected to an input of flip-flop 36. The input of inverter 41 is connected to the output of the memory cell K$_{out(i)}$.

In FIG. 5, the connection to control unit 8 is realized by R, T$_{MO}$, T$_M$, $\sim$T$_{MO}$, and $\sim$T$_M$. In the multiple response state, an N-input OR gate, at the inputs of which there are generated Q outputs of all N number triggers of register 6, blocks output unit 7 up to completion of the function and influences register 2 by reversing it from an input register into an output one.

Figure 6:
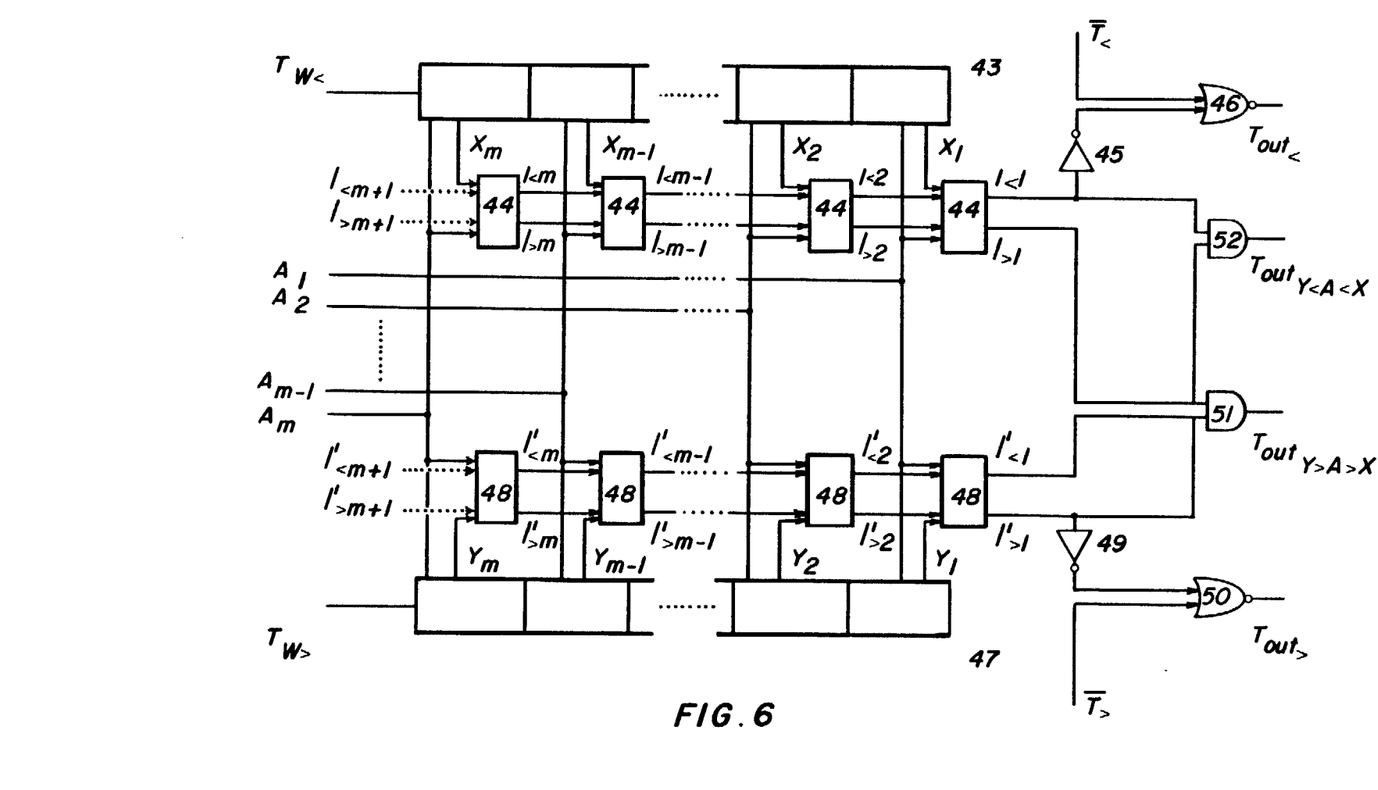
FIG. 6 is a block diagram of the interval unit.

Referring now to FIG. 6, the interval unit 9 contains a register 43 for determining all numbers smaller than a preset number with comparators 44 and a register 47 for determining all numbers bigger than a preset number with comparators 48 where an input of the respective comparator is connected to outputs X$_i$ and Y$_i$ of every bit of the two registers. The other two inputs of comparators 44 and comparators 48 are connected to outputs I$_{<(i+1)}$ and I$_{>(i+1)}$ of their preceding comparators.

The A$_i$ outputs of the input-output information data register 2 are connected to the inputs of the respective stages of the register 43 for specifying all numbers smaller than a preset figure, the inputs of the respective stages of the register 47 for specifying all numbers bigger than a preset number, an input of comparators 44 and an input of comparators 48.

The internal writing clock signal T$_{W<}$ is connected to the input of the register 43 for specifying all numbers smaller than a preset number, and the internal writing clock signal T$_{W>}$ is connected to an input of the register 47 for determining all numbers bigger than a preset number.

The output "smaller" I$_{<(1)}$ of comparator 44 corresponding to the first stage of the register 43 for the determination of all numbers smaller than a preset number and the "bigger" output I'$_{>(1)}$ of comparator 48 corresponding to the first stage of the register 47 for the determination of all numbers bigger than a preset number are connected to the inputs of second AND gate 52, the output of which $T_{out(Y<A<X)}$ is for an internal clock signal determining all the numbers in a preset interval.

The "bigger" output $I_{>(1)}$ of comparator 44, corresponding to the first stage of the register 43 specifying all numbers smaller than a preset number and the "smaller" output $I'_{<(1)}$ of comparator 48 corresponding to the first stage of the register 47 for specifying all numbers bigger than a preset number are connected to inputs of third AND gate 51 the output of which, $T_{out(Y>A>X)}$, is for an internal clock signal for determining a numbers outside a preset interval.

The $I_{<(1)}$ "smaller" output of comparator 44 corresponding to the first stage of the register 43 for all numbers smaller than a preset number through fourth inverter 45 and internal clock signal $\sim T_<$ for a preset "smaller" condition are connected to the inputs of tenth NOR gate 46, the output of which is for internal clock signal $T_{out(<)}$ for "smaller".

The $I'_{<(1)}$ of comparator 48, corresponding to the first stage of the register 47 specifying all numbers bigger than a preset number through fifth inverter 49 and internal clock signal $\sim T_{22}$ for a "bigger" preset condition are connected to the inputs of eleventh NOR gate 50 the output of which is for an internal $T_{out(>)}$ "bigger" internal clock signal.

Figure 7:
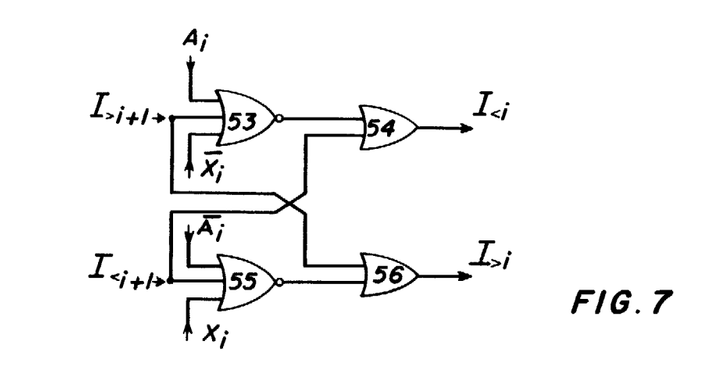
FIG. 7 is a logical schematic of a comparator of a register for specifying all numbers smaller than a preset number.

Referring now to FIG. 7, every comparator 44 contains twelfth NOR gate 53, one of its inputs being connected to output $\sim X_i$ of the register 43 specifying all numbers smaller than a preset number, another input connected to output $A_i$ of the register for input-output information data 2, and its third input is connected to the "bigger" output $I_{>(i+1)}$. The output of NOR gate 53 and the "smaller" output $I_{<(i+1)}$ of the receding comparator 44 are connected to the inputs of first OR gate 54, the output of which is a "smaller" output $I_{<(i)}$ of comparator 44.

Output $\sim A_i$ of the input-output information data register 2, output $X_i$ of the register 43 for specifying all numbers smaller than a preset number and the "smaller" output $I_{<(i+1)}$ of the preceding comparator 44 are connected to the inputs of thirteenth NOR gate 55. The output of NOR gate 55 and the "bigger" output $I_{>(i+1)}$ of the preceding comparator 44 are connected to the inputs of second OR gate 56, which is an output "bigger" $I_{>i}$ of comparator 44.

Figure 8:
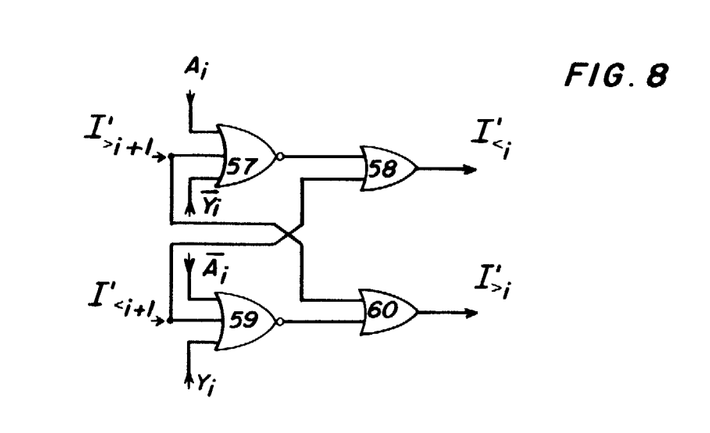
FIG. 8 is a logical schematic of a comparator of the register for specifying all numbers bigger than a preset number.

Referring now to FIG. 8, every comparator 48 contains fourteenth NOR gate 57, one of its inputs being connected to output $\sim Y_i$ of the register 47 for determining all numbers bigger than a preset number, another of its inputs connected to output $A_i$ of the input-output information data register 2, and its third input connected to the "bigger" input $I'_{>(i+1)}$ of the preceding comparator 48. The output of NOR gate 57 and the "smaller" output $I'_{<(i+1)}$ of the preceding comparator 48 are connected to the inputs of third OR gate 58, the output of which is a "smaller" output $I'_{<(i)}$ of comparator 48.

Output $\sim A_i$ of the input-output information data register 2, output $Y_i$ of the register 47 specifying all numbers bigger than a preset number and the "smaller" output $I'_{<(i+1)}$ of the preceding comparator 48 are connected to the inputs of fifteenth NOR gate 59. The output of NOR gate 59 and the "bigger" output $I'_{>(i+1)}$ of the preceding comparator 48 are connected to the inputs of fourth OR 60, the output of which is a "bigger" output $I'_{>(i)}$ of comparator 48.

MANNER OF OPERATION

The operation of the Associative Main Store, in accordance with the invention, is as follows:

One of the two possible states of input chip select $\sim$CHIP SELECT (FIG. 1) - logical "1" or logical "0" - enables access to the Main Store for operation with it, and the other state disables it. This input is used to extend the volume of the memory unit by an extra device of this type. One of the two possible states of the read/write input READ/WRITE - logical "0" or logical "1" - determines the implementation of the functions "associative reading YES/NO" or "writing new information". The logical "1" of the delete input DELETE determines the function "information deletion under a preset condition". Logical "1" in the reset input RESET sets the device in initial position. The masking input MASK has a multifunctional purpose: masking of the input information of a random combination of its bits and participation as a condition in part of the cycles of the function "multiple response" in conjunction with the multiple response input MULTIPLE RESPONSE. The logical "1" of input smaller than SMALLER or input of bigger than BIGGER determine the commencement of one of the functions "all numbers smaller than a preset NUMBER" or "all numbers bigger than a preset number". Logical "1" across both inputs determines the function "all numbers in the FROM/TO interval". The information output INF supplies information about the state or the termination of the indicated functions. $A_1$ to $A_M$ are external outputs of the device which for specific cycles of the individual functions appear as inputs for the associative M-bit condition, and for other cycles they appear as outputs for the M-bit information written in the device.

The "associative reading YES/NO" function is basic for this type of device and for this reason this function of the device fully overlaps by potentials and principles of operation the "associative reading YES/NO" function of the well known associative main store.

A separate masking cycle is required in order to mask one or several digits of the input data. Logical "1" is fed to those inputs $A_i$ (FIG. 2) which have to be masked. Potential logical "1" is also fed to the external masking input MASK which potential should be maintained all the time until there is a requirement for masking these inputs. In the initial moment, the output of the M-input NOR gate 12 is logical "1" and any potential feeding of logical "1" to any digit of the input data turns the output of AND gate 11 of the respective digit into logical "1" which reverses flip-flop 10 and the $Q_i$ output becomes logical "1". Output $Q_i$ of flip-flop 10 performs two functions: resets the M-input NOR gate 12 thus disabling AND gate 11 of all digits of the input information and prohibits any repeated masking; it turns in potential logical "0" and output $A_i$ and the inverse $\sim A'_i$ output. The logical "0" of these two outputs is sensed by the memory cell and the comparator integrated in it as information equal to the input data.

The memory cell (FIG. 3) is made on the basis of a standard 6-transistor memory cell of the static random access memory (RAM) made of transistors T16 to T21 and a comparator integrated to it, the logical equivalent of which is achieved by means of two key transistors T22 and T23 and a unifying M-input NOR gate distributed by the individual digits by means of transistor $T24_i$. In the presence of equivalent information, i.e. the potential of a common point A and of input $A'_i$, being for example, logical "1", transistor T22 is disabled and transistor T23 is enabled and across it the potential logical "0" across input $\sim A'_i$ is transferred to a common point C.

If there is equivalence for all stages (digits), then the output of the M-input NOR gate formed by respective transistors T24$_i$, shall become logical "1" which is a condition that the output of output unit 7 should also become logical "1". In applying the function "associative reading YES/NO", this is an indication for the availability in the Store of information equal to the input information. Writing of new information in the memory cell is made by supplying potential logical "1" across external input READ/WRITE where the control unit 8 shall generate clock $T_W$ and the input information is supplied across the inputs of the input-output information data unit 1, and across the input-output information data register 2 it is supplied to inputs $A'_i$ and $\sim A'_i$ of the memory cell. Transistors T17 and T20 are enabled and common point A receives information from $A'_i$ and common point B receives the information of $\sim A'_i$.

Data reading from the memory cell is a variety of the "multiple response" function trying to find realization of this function for input information having all its bits masked. Clock $T_{R(i)}$ is generated which enables T25 and if the potential of common point A is logical "1" and of common point B logical "0", $\sim A'_i$ is discharged to potential logical "0" across the enabled transistor T23, and $A'_i$ keeps its potential logical "1". For this, before the realization of the reading function, $A'_i$ and $\sim A'_i$ charged to potential logical "1".

The address register 5 performs the following functions: every stage registers the writing of an M-bit input information (data); every stage guarantees clock for writing $T_{Wi}$ for an M-bit input information; every preceding bit guarantees enabling writing $T_{WE(i)}$. In the initial resetting of the circuit, output $Q_i$ of flip-flop 35 (FIG. 4) for all stages of the address register 5 is logical "0" which means not fully occupied memory regardless of the state of the memory cells. Moreover, logical "0" of output $Q_i$ supplied to NOR gate 31 enables the generation of a writing clock $T_{W(i)}$, , disables transistor T27 and blocks the distribution of clock $T_{WE(i)}$ to the next stage, logical "1" across output $\sim Q_i$ enables transistor T26 and $T_{WE(i+1)}$ becomes logical "1", i.e. there is a ban on the generation of a writing clock $T_{W(i+1)}$. Potential logical "1" across the external input READ/WRITE should be supplied in order to write data in the memory, where the control unit 8 generates writing clock $\sim T_W$ with potential logical "0".

If, for a given stage, $T_{WE(i)}$ is also logical "0", then $T_{W(i)}$ is generated and the input data are written in the memory cell. After the termination of writing, conditions equal to those in the function "associative reading YES/NO" are produced where output $K_{out(i)}$ becomes logical "1". Thus, the writing clock $T_{W(i)}$ across inverter 30 and the indication for a completed writing logical "1" of $K_{out}$ across inverter 33 enable the output of NOR gate 32 to set at logical "1" which switches flip-flop 35. This new state of flip-flop 35 specifies inhibition for the generation of a new clock $T_{W(i)}$, the logical "1" across output $Q_i$ disables NOR gate 31 and simultaneously the enabling of writing $T_{WE(i)}$ across the enabled key transistor T27 is transmitted to the next stage.

The connection in series of transistors T28 and T29 to $K_{out(i)}$ supplies logical "0" to $K_{out(i)}$ memory cells where there is still no data writing which is equal to reset memory cells.

The "information erasing (deleting) from memory cell" cycle is performed by supplying M-bit input data (it can be masked) to the input-output information data 1 unit which should be deleted. Across the external input DELETE of the device logical "1" is supplied. The control unit 8 generates a deletion clock $T_{del}$, and its inverse signal $\sim T_{del}$, together with the inverse signal of $K_{out(i)}$ actuate NOR 34 gate and its output becomes logical "1". This is a condition for flip-flop 35 to be reswitched to its initial state which is equal to deleted information. Similar is the effect of the external general reset clock RESET, but its action is common for all stages of the address register 5.

The function "multiple response" is achieved in several sub-cycles: As the Associative Main Store is organized in such a manner not to allow any written information duplication, that means that input information masked to a given level is always used in the cycle "multiple response". Masked input data for which the respective multiple writing in the memory is searched is fed in the first cycle across the input of the Input-output information data unit 1, and potential logical "1" is supplied to the external inputs MASK and MULTIPLE RESPONSE. Under these conditions the control unit 8 generates clocks $T_{MASK}$ and $T_{MO}$ with potential logical "1" and clocks $\sim T_{MASK}$ and $\sim TMO$ with potential logical "0". If the logical information is contained in the memory, $K_{out(i)}$ is logical "1" and by inverter 41 the output of NOR gate 40 is enabled to be set in logical "1" which sets flip-flop 36 and output $Q_i$ receives potential logical "1". This potential across output $Q_i$ enables transistor T37, and transistor T38 is disabled by the logical "0" across output $\sim Q_i$. The reading enabling clock to the next stage $T_{RE(i+1)}$ becomes logical "1" thus disabling reading. This ends the first sub-cycle, and flip-flops 36 of all stages of the multiple response register 6, the respective memory cells of which contain the input data, are reswitched towards their initial state. The following sub-cycles have such number as the input masked information is contained in the memory. In these sub-cycles logical "0" is supplied to the external input MASK and logical "1" to the external input MULTIPLE RESPONSE which at the end of each subcycle receives potential logical "0". This is a condition that at the beginning of every sub-cycle, a reading clock $T_{R(i)}$ should be generated from the output of NOR gate 39 and read the full unmasked information in the memory matrix 4, equivalent to the preset input data.

At the end of the sub-cycle, clock $T_{MO}$ becomes logical "0" and, as information is read from the memory matrix 4, then this is a condition similar to the function "associative reading YES/NO" and $K_{out(i)}$ is logical "1".

Through inverter 41, a condition is produced that the output of NOR gate 42 should become logical "1" and flip-flop 36 returns to its initial state, output $Q_i$ receiving potential logical "0". This effects enabling of transistor T38 and disabling of transistor T37, and the reading enabling $T_{RE(i)}$ is transmitted to the next stage for the following sub-cycle.

The interval unit 9 (FIG. 6) contains two registers and a logic circuit, performing three functions: all numbers smaller than a preset number, which means reading information written in memory which is smaller in value than a preset input information; all numbers bigger than a preset number, which means reading of information written in memory which is higher in value than the preset input information; and all numbers in the interval FROM/TO which means reading information written in the memory which is in or outside a preset interval determined by two input information (data). Several sub-cycles are required:

In the function "all numbers smaller than a preset number", in first sub-cycle of the input of the input-output information data unit 1, the input information is supplied for which the condition should be fulfilled. Logical "1" is supplied across the external input for "smaller" SMALLER and the control unit 8 generates a clock for writing $T_{W<}$ where the input information is written in the register 43 for specifying all numbers smaller than a preset number. In the subsequent sub-cycles, the information written in the memory matrix 4 is read consecutively and by the input-output information data register 2, it is supplied to the interval unit 9 across inputs $A_1$ to $A_M$. The information from the memory matrix 4 is compared stage by stage by means of comparators 44 with the input information written in register 43 and if the function condition is fulfilled, NOR gate 46 generates a clock $T_{out(<)}$, which actuates the input-output information data unit 1. This information from the memory is indicated across the outputs of the input-output information data unit 1.

The number of these sub-cycles is equal to the number of the information-filled memory cells of the memory matrix 4, and in the worst case it is equal to N.

In the function "all numbers bigger than a preset number", the input information is supplied in first sub-cycle across the input of the input-output information data unit 1 for which the condition has to be fulfilled. Logical "1" is supplied across the external input for "bigger" BIGGER and the control unit 8 generates a clock for recording $T_{W>}$ where the input information is written in the register 47 for the determination of all numbers bigger than a preset number. In the subsequent cycles, the information written in the memory matrix 4 is read consecutively and, by means of the input-output information data register 2, it is supplied to the interval unit 9 of inputs $A_1$ to $A_M$. The information from the memory matrix 4 is compared stage by stage by means of comparator 48 with the input information written in the register 47 for specifying all numbers bigger than a preset number and, if the condition of the function is fulfilled, NOR gate 50 generates a clock $T_{out(>)}$ which actuates the input-output information data unit 1. This information from memory is indicated across the outputs of the input-output information data unit 1.

The number of these sub-cycles is equal to the number of the information-filled memory cells of the memory matrix 4 and in the worst case is equal to N.

In the function "all numbers in the interval FROM/TO", in the first sub-cycle of the input of the input-output information data unit 1, the input information limiting the interval from the top is supplied, and potential logical "1" is supplied to the external SMALLER input. The input information is written in the register 43 specifying all numbers smaller than a preset number. In the second sub-cycle of the input of the input-output information data unit 1, input information limiting the interval from below is supplied, and potential logical "1" is to the external BIGGER input. The input information is written in the register 47 for determining all numbers bigger than a preset number. Potential logical "1" is supplied from the third sub-cycle until the completion of the function of the external SMALLER and BIGGER inputs and consecutive reading of the information written in the memory matrix 4 commences, and, by means of the input-output information data register 2, it is supplied to the interval unit 9 of inputs to $A_1$ to $A_M$. The information from the memory matrix 4 is compared stage by stage by means of comparators 44 and comparators 48 simultaneously with the input information determining the interval. If the information written in the memory meets with the condition of the function, then clock $T_{out(Y<A<X)}$ or $T_{out(Y>A>X)}$ is generated across the output of AND gate 51 or AND gate 52 which actuates the input-output information data unit 1. This information is indicated across the output of the input-output information data unit 1.

The number of these sub-cycles is equal to the number of the memory cells filled by information from the memory matrix 4, and in the worst case it is equal to N.

We claim:

1. An associative main store comprising
a memory matrix containing memory cells and having input buses and output buses;
an input-output information data unit having M-bit external bidirectional input-output data buses and M-bit bidirectional input-output data buses and an input-output information data register, having M-bit bidirectional input-output data buses, said bidirectional buses of said input-output information data unit being connected with corresponding bidirectional data buses of said input-output information data register, said input-output information data register also having an output bus;
a masking register having an input bus and an output bus, said input bus of said masking register being connected to the output bus of said input-output information data register and the output bus of said masking register being connected to an input bus of said memory matrix;
an output bus of the memory matrix being connected to an input bus of the input-output information data register;
san address register having input buses and output buses, an output bus of said memory matrix being connected to an input bus of said address register, an output bus of said address register being connected to an input bus of said memory matrix;
a multiple response register having input buses and output buses and an output unit having input buses and an output, an output bus of said multiple response register being connected to an input bus of said input-output information data register, an input bus of said memory matrix and an input bus of said output unit;
a control unit having inputs and output buses, and an interval unit having input buses and output buses;
an input bus of said output unit being connected to an output bus of said address register, an output bus of said control unit, and an output bus of said interval unit, an output bus of said interval unit being connected to an input bus of said input-output information data unit;
output buses of said control unit being connected to input buses of the input-output information data unit, the input-output information data register, the masking register, the address register, the multiple response register, and the interval unit;

the inputs of said control unit being connected to external inputs for controlling chip selection, read/write, delete, general reset, masking, multiple response, for all numbers smaller than a preset number, for all numbers bigger than a preset number and an output of said address register;

input buses of said interval unit being connected to a bidirectional input-output bus of the input-output information data unit and of the input-output information data register; and an output bus of said memory matrix being connected to an input bus of said multiple response register, the output of the output unit being an external information output of the associative main store.

2. An associative main store as claimed in claim 1, said masking register comprising individual stages each containing a first flip-flop having two inputs and a Q and ~Q output, one input of which being connected to an internal masking clock (MASK);

a first AND gate component having two inputs and an output, the other input of said first flip-flop being connected to the output of said first AND gate component, one input of said first AND gate component being connected to a corresponding bit of an output bus of said input-output information data register;

a first NOR gate component having inputs and an output, the other input of said first AND gate component being connected to the output of said first NOR gate component, the inputs of which are connected to the $Q_i$ to $Q_m$ outputs of the flip-flops of all stages of the masking register;

an input unit having two inputs and two outputs, the Qi output of said first flip-flop being connected to one input of said input unit and said corresponding bit of an output bus of said input-output information data register being connected to the other input of said input unit;

second and third NOR gate components, each having two inputs and an output, one output of said input unit being connected to one input of said second NOR gate component and the other output of said input unit being connected to one input of said third NOR gate component;

the other input of each of said second and third NOR gate components being connected to the $Q_i$ output of said first flip-flop; and the output of the second NOR gate component and the output of the third NOR gate component being connected to an input bus of said memory matrix.

3. An associative main Store, as claimed in claim 2, said memory matrix comprising a plurality memory cells, each cell comprising first, second, third, fourth, fifth, sixth, seventh, eighth, ninth and tenth transistors each transistor having a source, a drain, and a gate;

the drain of said first transistor being connected to the source of said second transistor, the source and gate of said third transistor, the gate of said fourth transistor and the gate of said fifth transistor;

the output of said second NOR gate component being connected to the drain of said second transistor and the drain of said sixth transistor;

the output of said third NOR gate component being connected to the drain of said seventh transistor and the drain of said fifth transistor;

an internal writing clock being connected to the gates of said second and seventh transistors;

the drain of said fourth transistor being connected to the source of said seventh transistor, the source and gate of said eighth transistor, the gate of said first transistor and the gate of said sixth transistor;

the source of said sixth transistor being connected to the source of said fifth transistor, the drain of said ninth transistor and the gate of said tenth transistor;

the drain of said tenth transistor being an output of the memory cell;

an internal reading clock being connected to the gate of said ninth transistor;

a circuit supply voltage being connected to the drains of said third and eighth transistors; and a common ground of the circuit being connected to the sources of said first, fourth, ninth and tenth transistors.

4. An associative main store as claimed in claims 1, 2, or 3 wherein every comparator contains twelfth and thirteenth NOR gate components, each having three inputs and an output; and first and second OR gate components, each having two inputs and an output;

the output of said twelfth NOR gate being connected to an input of said first OR gate component and one of the inputs of said twelfth NOR gate being connected to an input of said second OR gate component, the other input of said second OR gate component being connected to the output of said thirteenth NOR gate component, one of the inputs of said thirteenth NOR gate component being connected to the second input of said first OR gate component.

5. An associative main store as claimed in claims 1, 2, or 3, said multiple response register comprising individual stages, each stage containing seventh, eighth, and ninth NOR gate components, each having three inputs and an output;

fifteenth and sixteenth transistors, each transistor having a source, a drain, and a gate;

a third inverter, having an input and an output; and a third flip-flop having three inputs and $Q_i$ and $\sim Q_i$ outputs;

the $Q_i$ output of said third flip-flop being connected to the gate of said fifteenth transistor and the $\sim Q_i$ output being connected to the gate of said sixteenth transistor and an input of said seventh NOR gate component;

the output of said seventh NOR gate component being an internal reading clock and the second input of said seventh NOR gate component being connected to an internal clock for enabling reading which is also connected to the source of said sixteenth transistor;

the drain of said sixteenth transistor being connected to the source of said fifteenth transistor and an internal clock for enabling reading to a next stage of the multiple response register and being connected to the source of said fifteenth transistor;

the drain of said fifteenth transistor being connected to a circuit supply voltage;

the third input of said seventh NOR gate component being connected to a bus of an inverse internal clock for multiple response and to an input of said eighths NOR gate component;

the output of said eighth NOR gate component being connected to an input of the third flip-flop;

an inverse internal masking clock being connected to an input of said eighth NOR gate component, another input of which is connected to the output of said third inverter and to an input of said ninth NOR agate component;

the output of said ninth NOR gate component being connected to another input of said third flip-flop;

an internal multiple response clock and an internal masking clock being connected to two inputs of said ninth NOR gate component;

an internal general reset clock being connected to an input of said third flip-flop;

the input of said third inverter being connected to the output of the memory cell.

6. An associative main store as claimed in claims 5, said interval unit comprising;

an M-bit first register for determining all numbers smaller than a preset number with a respective M-number of first comparators; and an M-bit second register for determining all numbers bigger than a preset number with a respective M-number of second comparators;

said registers each having a clock input and M-number of data inputs and outputs;

said comparators each having four inputs and two outputs, one of said inputs being a smaller input <, another of said inputs being a bigger input >, and said outputs being respectively a smaller output < and a bigger output >;

one input of each comparator being connected a corresponding output of a corresponding stage of each register;

the bigger > and smaller < inputs of each comparator being connected to the corresponding bigger > and smaller < outputs of a preceding comparator, and the fourth input of each comparator being connected to a respective of the M-number of outputs of the input-output information data register;

outputs of said input-output information data register also being connected to respective data inputs of each of said registers;

internal clock writing signals being connected to the clock input of each register;

fourth and fifth inverters, each having an input and an output;

second and third AND gate components, each having two inputs and an output;

tenth and an eleventh NOR gate components, each having two inputs and an output;

the smaller output < of the first comparator corresponding to the first stage of the first register and the bigger output > of the second comparator corresponding to the first stage of the second register being connected to the inputs of said second AND gate component, the output of which supplies an internal clock signal for determining all numbers inside a preset interval;

the bigger output > of the first comparator corresponding to the first stage of the first register and the smaller output < of the second comparator corresponding to the first stage of the second register being connected to the inputs of said third AND gate component, the output of which supplies an internal clock signal for determining all numbers outside a preset interval;

the smaller output < of the first comparator corresponding to the first stage of the first register being connected to the input of said fourth inverter;

the output of said fourth inverter and an inverse internal clock signal for a preset condition for "smaller" being connected to the inputs of said tenth NOR "gate" component, the output of which supplies an internal clock for "smaller" signal;

the bigger output > of the second comparator corresponding to the first stage of the second register being connected to the input of said fifth inverter;

the output of said fifth inverter and an inverse internal clock signal for a preset condition for "bigger" being connected to the inputs of said eleventh NOR gate component, the output of which supplies an internal clock for "bigger" signal.

7. An associative main store as claimed in claims 1, 2, or 3, said interval unit comprising an M-bit first register for determining all numbers smaller than a preset number with a respective M-number of first comparators; and an M-bit second register for determining all numbers bigger than a present number with a respective M-number of second comparators;

said registers each having a clock input and M-bit number of data inputs and outputs;

said comparators each having four inputs and two outputs, one of said inputs being a smaller than input <, another of said inputs being a bigger than input >, and said outputs being respectively a smaller than output < and a bigger than output >;

one input of each comparator being connected a corresponding output of a corresponding stage of each register;

the bigger than > and smaller than < inputs of each comparator being connected to the corresponding bigger than > and smaller than < outputs of a preceding comparator, and the fourth input of each comparator being connected to a respective of the M-number of outputs of the input-output information data register;

respective outputs of said input-output information data register also being connected to inputs of respective stages of each of said registers;

internal clock writing signals being connected to the clock input of each register;

fourth and fifth inverters, each having an input and an output;

second and third AND gate components, each having two inputs and an output;

tenth and an eleventh NOR gate components, each having two inputs and an output;

the smaller output < of the first comparator corresponding to the first stage of the first register and the bigger output > of the second comparator corresponding to the first-stage of the second register being connected to the inputs of said second AND gate component, the output of which supplies an internal clock signal for determining all numbers inside a preset interval;

the bigger output > of the first comparator corresponding to the first stage of the first register and the smaller output < of the second comparator corresponding to the first stage of the second register being connected to the inputs of said third AND gate component, the output of which supplies an internal clock signal for determining all numbers outside a preset interval;

the smaller output < of the first comparator corresponding to the first stage of the first register being connected to the input of said fourth inverter;

the output of said fourth inverter and an inverse internal clock signal for a preset condition for "smaller" being connected to the inputs of said tenth NOR gate component, the output of which supplies an internal clock for "smaller" signal;

the bigger output > of the second comparator corresponding to the first stage of the second register being connected to the input of said fifth inverter;

the output of said fifth inverter and an inverse internal clock signal for a preset condition for "bigger" being connected to the inputs of said eleventh NOR gate component, the output of which supplies an internal clock for "bigger" signal.

8. An associative main store as claimed in claim 7 wherein every comparator contains twelfth and thirteenth NOR gate components, each having three inputs and an output; and first and a second OR gate components, each having two inputs and an output;

the output of said twelfth NOR gate component being connected to an input of said first OR gate component and one of the inputs of said twelfth NOR gate component being connected to an input of said second OR gate component, the other input of said second OR gate component being connected to the output of said thirteenth NOR gate component, one of the inputs of said thirteenth NOR gate component being connected to the second input of said first OR gate component.

9. An associative main store as claimed in claims 1, 2, or 3, said address register comprising individual stages each containing eleventh, twelfth, thirteenth and fourteenth transistors, each transistor having a source, a drain, and a gate;

fourth and fifth NOR gate components each having two inputs and one output, a sixth NOR gate component, having three inputs and an output; first and second inverters, each having an input and an output; and a second flip-flop having three inputs and $Q_i$ and $\sim Q_i$ outputs, one input being connected to an internal general reset clock, another input being connected to the output of said fourth NOR gate component and its third input being connected to the output of said fifth NOR gate component;

one input of said fifth NOR gate component being connected to an inverted internal information delete clock and the other input of said fifth NOR gate component being connected to the output of said first inverter;

the input of said first inverter being connected to an output of said memory cell and the drain of said eleventh transistor;

the gate of said eleventh transistor being connected to the output of said second inverter, and the source of said eleventh transistor being connected to the drain of said twelfth transistor;

the gate of said twelfth transistor being connected to the gate of said thirteenth transistor and the $\sim Q_i$ output of the second flip-flop;

the $Q_i$ output of said second flip-flop being connected to the gate of said fourteenth transistor and one input of said sixth NOR gate component;

another input of said sixth NOR gate component being connected to an inverted internal writing clock, and the third input of said sixth NOR gate component being connected to an internal clock for enabling writing and to the source of said fourteenth transistor;

the drain of said fourteenth transistor being connected to the source of said thirteenth transistor and an internal clock for enabling writing to a next stage of the address register;

the drain of said thirteenth transistor being connected to a supply voltage of the circuit;

the output of said sixth NOR gate component being an internal writing clock and being connected to the input of said second inverter;

the output of said second inverter being connected to an input of said fourth NOR gate component, the other input of said fourth NOR gate component being connected to the output of said first inverter;

the source of said twelfth transistor being connected to common ground of the circuit.

10. An associative main store as claimed in claims 9, said interval unit comprising an M-bit first register for determining all numbers smaller than a preset number with a respective M-number of first comparators; and an M-bit second register for determining all numbers bigger than a preset number with a respective M-number of second comparators;

said registers each having a clock input and M-number of data inputs and outputs;

said comparators each having four inputs and two outputs, one of said inputs being a smaller input <, another of said inputs being a bigger, and said outputs being respectively a smaller output > and a bigger output >;

one input of each comparator being connected a corresponding output of a corresponding stage of each register;

the bigger < and smaller > inputs of each comparator being connected to the corresponding bigger > and smaller < outputs of a preceding comparator, and the fourth input of each comparator being connected to a respective of the M-number of outputs of the input-output information data register;

outputs of said input-output information data register also being connected to respective data inputs of each of said registers;

internal clock writing signals being connected to the clock input of each register;

fourth and fifth inverters, each having an input and an output;

second and third AND gate components, each having two inputs and an output;

tenth and an eleventh NOR gate components, each having two inputs and an output;

the smaller output < of the first comparator corresponding to the first stage of the first register and the bigger output > of the second comparator corresponding to the first stage of the second register being connected to the inputs of said second AND gate component, the output of which supplies an internal clock signal for determining all numbers inside a preset interval;

the bigger output > of the first comparator corresponding to the first stage of the first register and the smaller output < of the second comparator corresponding to the first stage of the second register being connected to the inputs of said third AND gate component, the output of which supplies an internal clock signal for determining all numbers outside a preset interval;

the smaller output < of the first comparator corresponding to the first stage of the first register being connected to the input of said fourth inverter;

the output of said fourth inverter and an inverse internal clock signal for a preset condition for "smaller" being connected to the inputs of said tenth NOR gate component, the output of which supplies an internal clock for "smaller" signal;

the bigger output > of the second comparator corresponding to the first stage of the second register being connected to the input of said fifth inverter;

the output of said fifth inverter and an inverse internal clock signal for a preset condition for "bigger" being connected to the inputs of said eleventh NOR gate component, the output of which supplies an internal clock for "bigger" signal.

11. An associative main store as claimed in claim 9 wherein every comparator contains twelfth and thirteenth NOR gate components, each having three inputs and an output; and first and second OR gate components, each having two inputs and an output;

the output of said twelfth NOR gate component being connected to an input of said first OR gate component and one of the inputs of said twelfth NOR gate component being connected to an input of said second OR gate component, the other input of said second OR gate component being connected to the output of said thirteenth NOR gate component, one of the inputs of said thirteenth NOR gate component being connected to the second input of said first OR gate component.

12. An associative main store as claimed in claim 9, said multiple response register comprising individual stages, each stage containing seventh, eighth, and ninth NOR gate components, each having three inputs and an output;

fifteenth and sixteenth transistors, each transistor having a source, a drain, and a gate;

a third inverter, having an input and an output; and a third flip-flop having three inputs and $Q_i \sim Q_i$ outputs;

the $Q_i$ output of said third flip-flop being connected to the gate of said fifteenth transistor and the $\sim Q_i$ output being connected to the gate of said sixteenth transistor and an input of said seventh NOR gate component;

the output of said seventh NOR gate component being an internal reading clock and the second input of said seventh NOR gate component being connected to an internal clock for enabling reading which is also connected to the source of said sixteenth transistor;

the drain of said sixteenth transistor being connected to the source of said fifteenth transistor and being an internal clock for enabling reading to a next stage of the multiple response register;

the drain of said fifteenth transistor being connected to a circuit supply voltage;

the third input of said seventh NOR gate component being connected to a bus of an inverse internal clock for multiple response and to an input of said eighth NOR gate component;

the output of said eighth NOR gate component being connected to an input of the third flip-flop;

an inverse internal clock being connected to an input of said eighth NOR gate component, another input of which is connected to the output of said third inverter and to an input of said ninth NOR gate component;

the output said ninth NOR gate component being connected to another input of said third flip-flop;

an internal multiple response clock and an internal masking clock being connected to two inputs of said ninth NOR gate component;

an internal general reset clock being connected to an input of said third flip-flop;

the input of said third inverter being connected to the output of the memory cell.

13. An associative main store as claimed in claim 12 wherein every comparator contains twelfth and thirteenth NOR gate components, each having three inputs and an output; and first and second OR gate components, each having two inputs and an output;

the output of said twelfth NOR gate component being connected to an input of said first OR gate component and one of the inputs of said twelfth NOR gate component being connected to an input of said second OR gate component, the other input of said second OR gate component being connected to the output of said thirteenth NOR gate component, one of the inputs of said thirteenth NOR gate component being connected to the second input of said first OR gate component.

* * * * *